United States Patent
Yamamoto (10) Patent No.: US 7,390,694 B2
(45) Date of Patent: Jun. 24, 2008

(54) METHOD FOR MANUFACTURING AN ORGANIC SEMICONDUCTOR DEVICE, AS WELL AS ORGANIC SEMICONDUCTOR DEVICE, ELECTRONIC DEVICE, AND ELECTRONIC APPARATUS

(75) Inventor: Hitoshi Yamamoto, Chino (JP)

(73) Assignee: Seiko Epson Corporation, Tokyo (JP)

( * ) Notice: Subject to any disclaimer, the term of this patent is extended or adjusted under 35 U.S.C. 154(b) by 215 days.

(21) Appl. No.: 11/372,213

(22) Filed: Mar. 10, 2006

(65) Prior Publication Data

US 2006/0208266 A1   Sep. 21, 2006

(30) Foreign Application Priority Data

Mar. 16, 2005  (JP) .............................. 2005-075751

(51) Int. Cl.
*H01L 51/40* (2006.01)
(52) U.S. Cl. .............................. 438/99; 438/30; 438/158; 438/161; 257/E51.006; 257/E51.007
(58) Field of Classification Search .................. 438/30, 438/99, 158, 161; 257/E51.006, E51.007
See application file for complete search history.

(56) References Cited

U.S. PATENT DOCUMENTS 6,723,394 B1 * 4/2004 Sirringhaus et al. .......... 428/1.1

OTHER PUBLICATIONS

Takeo Kawase et al., "Inkjet Printing of Polymer Thin Film Transistors", Thin Solid Films 438-439, 2003, pp. 279-287.

* cited by examiner

*Primary Examiner*—George Fourson
*Assistant Examiner*—Julio J Maldonado
(74) *Attorney, Agent, or Firm*—Oliff & Berridge PLC (57) ABSTRACT

A method for manufacturing an organic semiconductor device having a gate electrode, a source electrode, a drain electrode, an organic semiconductor layer, a gate insulation layer, and a substrate, including: forming, on the substrate, an underlayer that contains an organic polymer material having a liquid crystal core and is oriented in a specific direction, before forming the organic semiconductor layer; and forming the organic semiconductor layer so as to orient the organic semiconductor layer along the orientation of the underlayer, wherein: the gate insulation layer insulates the source electrode and the drain electrode from the gate electrode; and the substrate supports the gate electrode, the source electrode, the drain electrode, the organic semiconductor layer, and the gate insulation layer.

12 Claims, 8 Drawing Sheets

METHOD FOR MANUFACTURING AN ORGANIC SEMICONDUCTOR DEVICE, AS WELL AS ORGANIC SEMICONDUCTOR DEVICE, ELECTRONIC DEVICE, AND ELECTRONIC APPARATUS

BACKGROUND

1. Technical Field

The present invention relates to a method for manufacturing an organic semiconductor device, as well as an organic semiconductor device, an electronic device, and an electronic apparatus.

2. Related Art

In recent years, the development of a thin-film transistor using an organic material (organic semiconductor material) that shows semiconductive electric conduction has been being progressed. Such a thin-film transistor can be formed by the solution process of a semiconductor layer that does not require an environment of high temperature and high vacuum. Also, due to some advantages including the suitability for a thinner and lighter device, flexibility, and low material cost, etc., such a transistor is expected to be promising as a switching element of a flexible display, etc.

As such a thin-film transistor, a transistor wherein a gate electrode, a source electrode, a drain electrode, an organic semiconductor layer, and a gate insulation layer are configured of organic materials has been proposed. "Inkjet printing of polymer thin film transistors", Takeo Kawase et al., in Thin Solid Films 2003 (pp. 279 to 287) is an example of related art.

By the way, as a property parameter for evaluating the performance of a thin-film transistor, the carrier mobility in a semiconductor layer can be named. The larger the carrier mobility in a semiconductor layer becomes, the faster the operating speed of a thin-film transistor becomes.

However, the carrier mobility of an organic semiconductor layer is lower by two or more digits than that of an inorganic semiconductor layer, which is generally configured of silicon, etc. Therefore, it is very difficult to increase the operating speed of a thin-film transistor having an organic semiconductor layer.

Hence, various studies have been in progress for further improvement of carrier mobility, in view of practical use.

SUMMARY

An advantage of the invention is to provide a method for manufacturing an organic semiconductor device that can achieve an easy manufacturing of an organic semiconductor device of high operating speed, as well as an organic semiconductor device of high operating speed, and an electronic device and an electronic apparatus that are highly reliable.

The above advantage is achieved by the invention described below.

According to a first aspect of the invention, a method for manufacturing an organic semiconductor device having a gate electrode, a source electrode, a drain electrode, an organic semiconductor layer, a gate insulation layer, and a substrate includes: forming, on the substrate, an underlayer that contains an organic polymer material having a liquid crystal core and is oriented in a specific direction, before forming the organic semiconductor layer; and forming the organic semiconductor layer so as to orient the organic semiconductor layer along the orientation of the underlayer. In this method, the gate insulation layer insulates the source electrode and the drain electrode from the gate electrode; and the substrate supports the gate electrode, the source electrode, the drain electrode, the organic semiconductor layer, and the gate insulation layer.

By the above method, an organic semiconductor device of high operating speed can be manufactured easily.

It is preferable that the method for manufacturing an organic semiconductor device according to the first aspect of the invention further includes: forming the source electrode and the drain electrode on the underlayer before forming the organic semiconductor layer; and forming the organic semiconductor layer with part of the organic semiconductor layer contacting the underlayer so as to orient the organic semiconductor layer along the orientation of the underlayer.

By the above method, an organic semiconductor device having a top-gate organic thin-film transistor of high operating speed can be manufactured easily.

It is preferable that the method for manufacturing an organic semiconductor device according to the first aspect of the invention further includes: forming the gate electrode on the underlayer before forming the organic semiconductor layer; forming the gate insulation layer with part of the gate insulation layer contacting the underlayer so as to orient the gate insulation layer along the orientation of the underlayer; and forming the organic semiconductor layer so as to orient the organic semiconductor layer along the orientation of the gate insulation layer.

By the above method, an organic semiconductor device having a bottom-gate organic thin-film transistor of high operating speed can be manufactured easily.

It is preferable that the method for manufacturing an organic semiconductor device according to the first aspect of the invention further includes: forming the source electrode and the drain electrode on the gate insulation layer before forming the organic semiconductor layer; and forming the organic semiconductor layer with part of the organic semiconductor layer contacting the gate insulation layer so as to orient the organic semiconductor layer along the orientation of the gate insulation layer.

By the above method, an organic semiconductor device having a bottom-gate organic thin-film transistor of high operating speed can be manufactured easily.

In the method for manufacturing an organic semiconductor device according to the first aspect of the invention, it is preferable that a material configuring the underlayer and a material configuring the gate insulation layer are the same.

By the above method, the orientivity of the gate insulation layer along the orientation of the underlayer is more ensured.

In the method for manufacturing an organic semiconductor device according to the first aspect of the invention, it is preferable that the source electrode and the drain electrode are formed along a specific direction with an interval in between.

By the above method, the carrier mobility in the channel region of the organic semiconductor layer can be improved.

In the method for manufacturing an organic semiconductor device according to the first aspect of the invention, it is preferable that the underlayer is formed after performing the orientation processing of the substrate.

By the above method, the orientivity of the underlayer is more ensured.

In the method for manufacturing an organic semiconductor device according to the first aspect of the invention, it is preferable that the orientation processing is performed by means of rubbing.

By the rubbing method, the orientation of the substrate becomes relatively easy.

In the method for manufacturing an organic semiconductor device according to the first aspect of the invention, it is preferable that the underlayer is formed by polymerizing a compound containing at least a single or two or more organic low-molecular materials having a polymeric group and a liquid crystal core.

By the above method, a more highly oriented underlayer can be formed.

In the method for manufacturing an organic semiconductor device according to the first aspect of the invention, it is preferable that the compound shows a liquid crystal phase under room temperature.

By the above method, a more highly oriented underlayer can be formed.

In the method for manufacturing an organic semiconductor device according to the first aspect of the invention, it is preferable that the compound has a nematic phase.

By the above method, a more highly oriented underlayer can be formed.

In the method for manufacturing an organic semiconductor device according to the first aspect of the invention, it is preferable that the compound has a smectic phase.

By the above method, a more highly oriented underlayer can be formed.

According to a second aspect of the invention, an organic semiconductor device includes: a gate electrode; a source electrode; a drain electrode; an organic semiconductor layer; a gate insulation layer that insulates the source electrode and the drain electrode from the gate electrode; and a substrate that supports the gate electrode, the source electrode, the drain electrode, the organic semiconductor layer, and the gate insulation layer. In this organic semiconductor device, an underlayer that contains an organic polymer material having a liquid crystal core and is oriented in a specific direction is formed between the substrate and the organic semiconductor layer so as to orient the organic semiconductor layer along the orientation of the underlayer.

With the above device, an organic semiconductor device of high operating speed can be obtained.

In the organic semiconductor device according to the second aspect of the invention, it is preferable that the orientation of the underlayer is approximately in parallel to the direction from either of the source electrode or the drain electrode to the other.

With the above device, the carrier mobility in the channel region of the organic semiconductor layer can be improved.

In the organic semiconductor device according to the second aspect of the invention, it is preferable that the organic semiconductor layer contains a polymer organic semiconductor material.

With the above device, orientation can be performed relatively easily by a simple method due to the superiority in carrier transportation of a polymer organic semiconductor material.

In the organic semiconductor device according to the second aspect of the invention, it is preferable that the organic semiconductor layer is configured of an organic semiconductor material containing mainly an aryl group.

Many organic polymer materials used as a material configuring the underlayer have an aryl group. Therefore, by configuring an organic semiconductor layer using an organic semiconductor material having an aryl group as a main material, high adhesiveness with the underlayer can be obtained.

According to a third aspect of the invention, an electronic device includes the organic semiconductor device according to the second aspect of the invention.

With the above device, a highly reliable electronic device can be obtained.

According to a fourth aspect of the invention, an electronic apparatus includes the electronic device according to the third aspect of the invention.

With the above apparatus, a highly reliable electronic apparatus can be obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of a method for manufacturing an organic semiconductor device, as well as an organic semiconductor device, an electronic device, and an electronic apparatus according to the invention will now be described in detail.

The following are examples where the organic semiconductor device according to the invention is applied to an active-matrix device.

First Embodiment

A first embodiment of an active-matrix device will be described.

Figure 1:
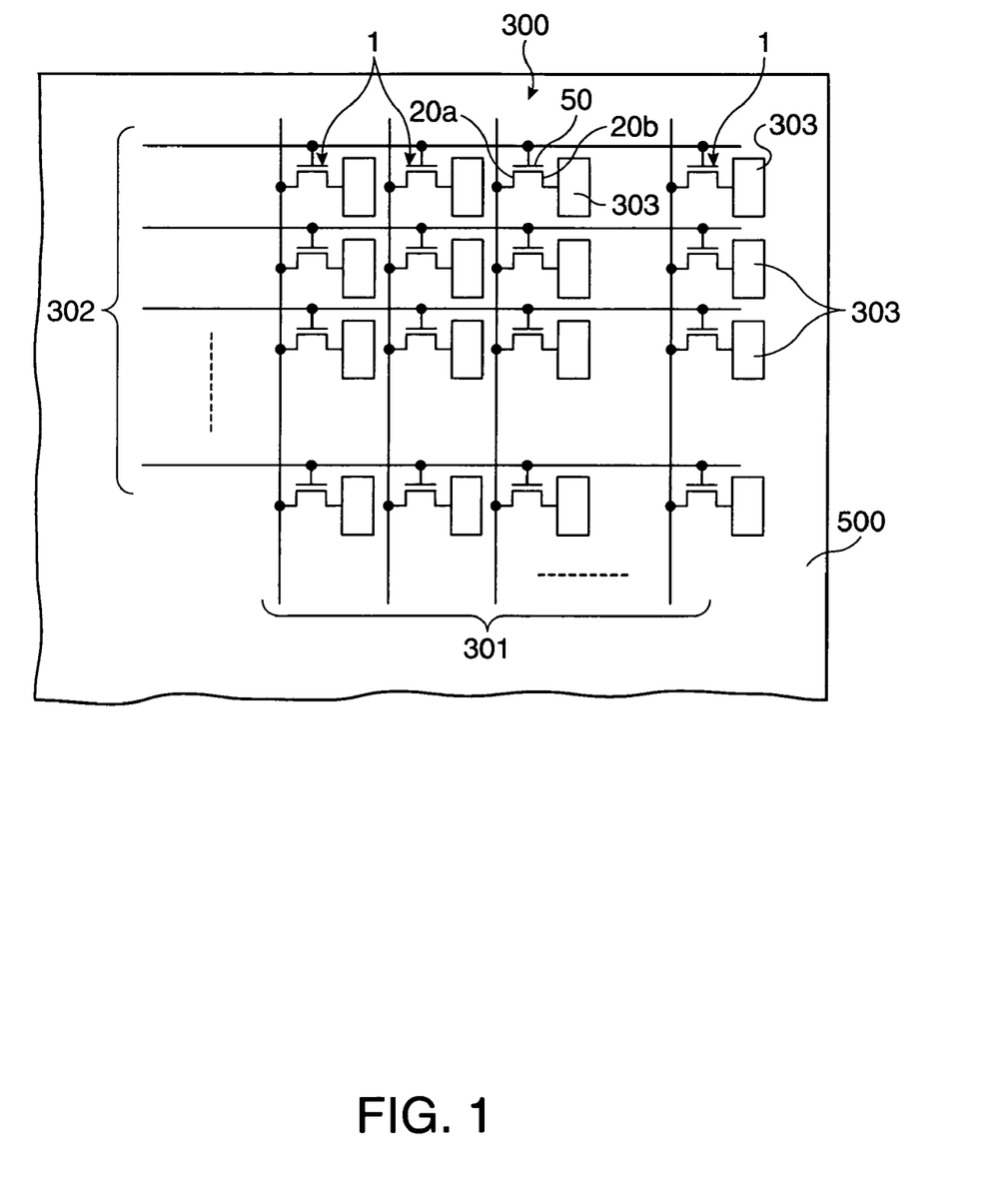
FIG. 1 is a block diagram showing the configuration of an active-matrix device to which an organic semiconductor device according to the second aspect of the invention is applied.
Figure 2A:
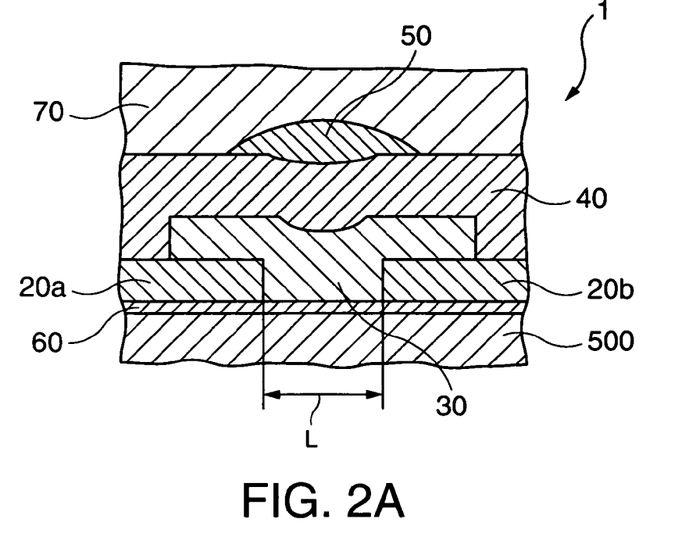
FIGS. 2A and 2B are diagrams (a vertical cross section and a plan view) showing the configuration of an organic thin-film transistor included in an active-matrix device according to a first embodiment.
Figure 2B:
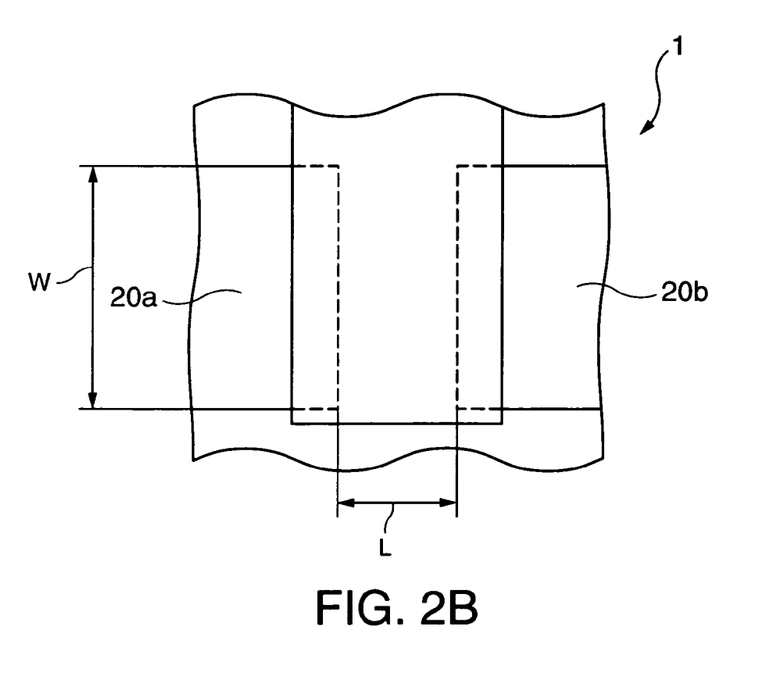
Figure 3A:
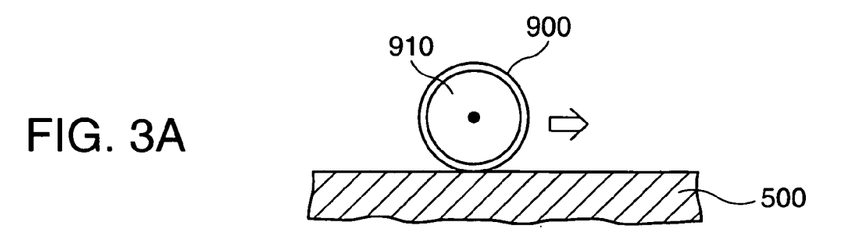
FIGS. 3A, 3B, 3C, 3D, and 3E are diagrams (vertical cross sections) for describing a method for manufacturing the organic thin-film transistor shown in FIGS. 2A and 2B.
Figure 3B:
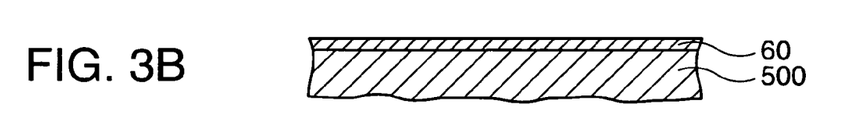
Figure 3C:
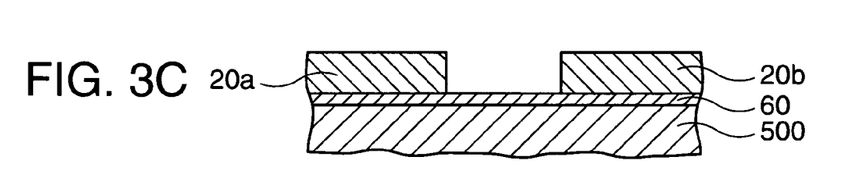
Figure 3D:
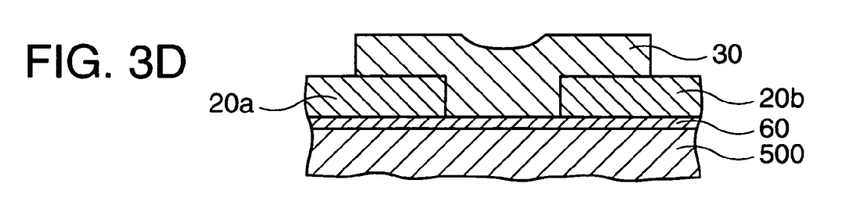
Figure 3E:
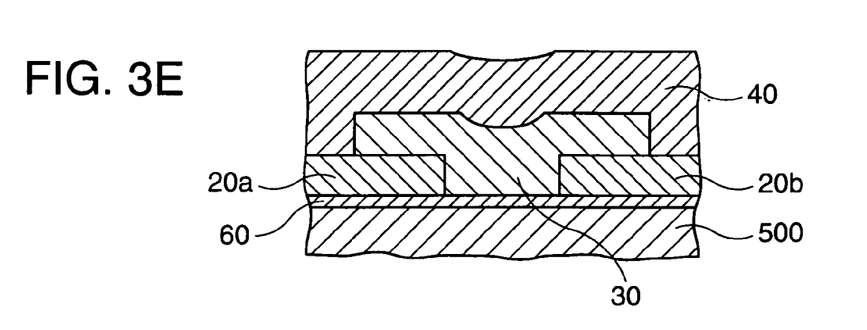
Figure 4F:
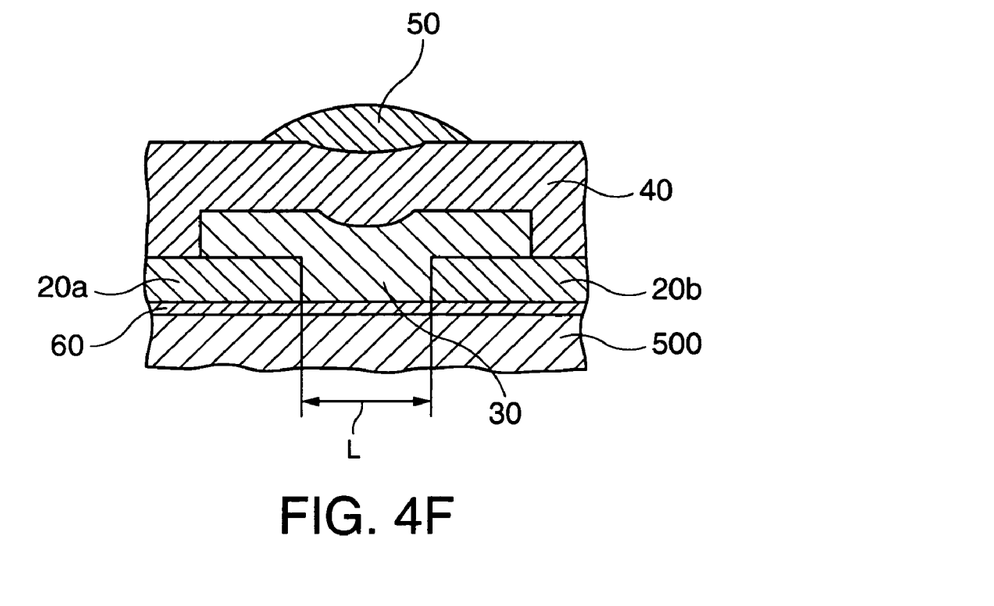
FIGS. 4F and 4G are diagrams (vertical cross sections) for describing a method for manufacturing the organic thin-film transistor shown in FIGS. 2A and 2B.
Figure 4G:
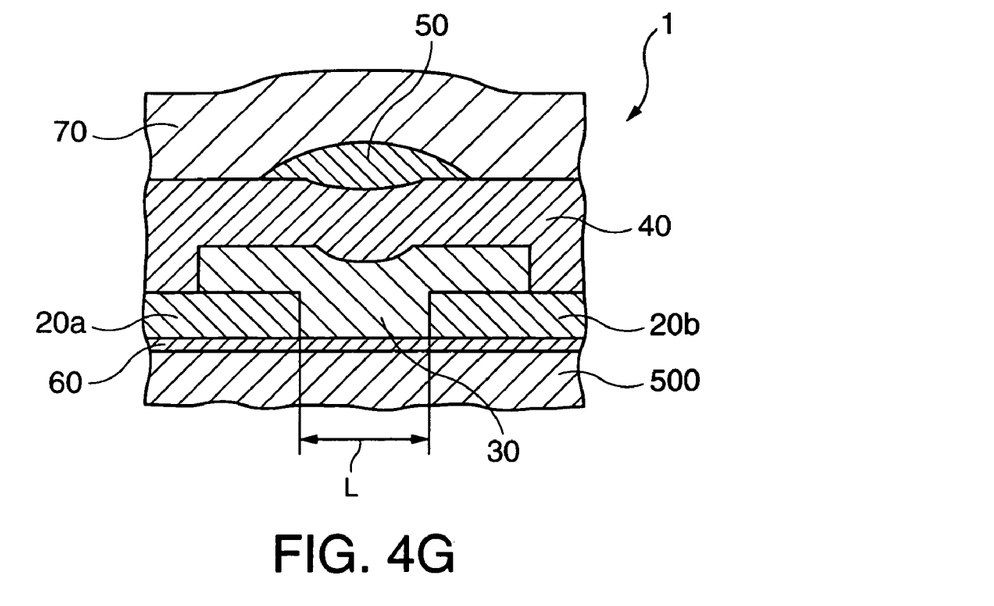

FIG. 1 is a block diagram showing the configuration of an active-matrix device to which an organic semiconductor device according to the second aspect of the invention is applied. FIGS. 2A and 2B are diagrams (a vertical cross section and a plan view) showing the configuration of an organic thin-film transistor included in an active-matrix device according to a first embodiment. FIGS. 3A to 3E and FIGS. 4F and 4G are diagrams (vertical cross sections) for describing a method for manufacturing the organic thin-film transistor shown in FIGS. 2A and 2B. In addition, in the following description, the upper side of FIGS. 2 to 4 is expressed as "top" and the lower side is expressed as "bottom."

An active-matrix device 300 shown in FIG. 1 has: a substrate 500; a plurality of data lines 301 and a plurality of scanning lines 302, both of which are provided on the substrate 500 and orthogonal to each other; an organic thin-film transistor 1 (hereinafter referred to as "thin-film transistor 1") provided near each intersection of the data line 301 and the scanning line 302; and pixel electrodes 303.

Further, a gate electrode 50 included in the thin-film transistor 1 is coupled to the scanning line 302, a source electrode 20a also included in the thin-film transistor 1 is coupled to the data line 301, and a drain electrode 20b also included in the thin-film transistor 1 is coupled to the pixel electrode (individual electrode) 303, which will be described later.

As shown in FIG. 2A, the thin-film transistor 1 according to the first embodiment is a top-gate thin-film transistor and has: a buffer layer (underlayer) 60 provided on the substrate 500; the source electrode 20a and the drain electrode 20b both provided on the buffer layer 60 with an interval in between; an organic semiconductor layer 30 provided in contact with the source electrode 20a and the drain electrode 20b; a gate insulation layer 40 placed between the organic semiconductor layer 30 and the gate electrode 50; and a protective layer 70 provided so as to cover the foregoing layers.

The configuration of each part will be described sequentially.

The substrate 500 supports each of the layers (parts) configuring the thin-film transistor 1 (active-matrix device 300).

As the substrate 500, such materials as: glass substrates; plastic substrates (resin substrates) configured of polyethylene terephthalate (PET), polyethylene naphthalate (PEN), polyethersulfone (PES), aromatic polyester (liquid crystal polymer), polyimide (PI), etc.; quartz substrates; silicon substrates; metal substrates; gallium arsenide substrates; etc. can be used.

In order to give flexibility to the thin-film transistor 1, a plastic substrate or a thin (relatively thin) metal substrate is selected as the substrate 500.

On the substrate 500, the buffer layer 60 is provided.

The buffer layer 60 is oriented in a specific direction, which is, in the first embodiment, approximately in parallel to the channel-length direction (horizontal direction in FIG. 2A) of the channel region. The buffer layer 60 oriented as such has a function for orienting the organic semiconductor layer 30, which will be described later.

With the above function, the orientation of the organic semiconductor layer 30 can be determined in a specific direction without complicating the configuration of the thin-film transistor 1 and, at the same time, the carrier mobility in the channel region can be improved. As a result, the thin-film transistor 1 of high operating speed and further the active-matrix device 300 of high operating speed can be obtained.

The buffer layer 60 is mainly configured of an organic polymer material having a liquid crystal core. Such a configuration contributes to the extremely high orientivity of the buffer layer 60. Therefore, the orientivity of the organic semiconductor layer 30 that is oriented in accordance with the buffer layer 60 also becomes very high, which improves the carrier mobility in the channel region of the thin-film transistor 1.

In the above description, the oriented buffer layer 60 means that most of the components in the organic polymer material that configures the buffer layer 60 are lined in approximately the same direction. However, it is allowable if some of the components are placed in quite different directions.

Examples of the liquid crystal core (a mesogen group) contained in such an organic polymer material include one of or a combination of two or more of the following: a benzene ring, a naphthalene ring, an anthracene ring, and a cyclohexane ring. Such organic polymer materials having a liquid crystal core have a high orientivity and therefore are preferable as a material configuring the buffer layer 60. Especially, a compound that is configured of at least two or more kinds of organic low-molecular materials having a polymeric group, as a polymerized precursor, as well as a liquid crystal core and shows a liquid crystal phase under room temperature is more preferable as a material of the buffer layer 60. It is much more preferable if the compound shows a nematic phase or a smectic phase under room temperature.

Further, by configuring the buffer layer 60 using such organic polymer materials, which have a low hygroscopicity, the infiltration of moisture into the organic semiconductor layer 30 can also be prevented.

Furthermore, by using a compound having an arylamine skeleton as a material configuring the organic semiconductor layer 30, as described later, the adhesiveness between the organic semiconductor layer 30 and the buffer layer 60 can be improved.

In addition, the above organic polymer material, which is highly insulative, is also preferable as a material configuring the gate insulation layer 40 in a second embodiment, which will be described later.

The average thickness of the buffer layer 60 is not limited to but preferred to be approximately 1 to 1000 nm or, more preferably, 10 to 700 nm.

On the buffer layer 60, the source electrode 20a and the drain electrode 20b are provided along the orientation of the buffer layer 60 with an interval in between.

Examples of the material configuring the source electrode 20a and the drain electrode 20b include: Au, Ag, Cu, Pt, Ni, Cr, Ti, Ta, and Al; or metal materials such as alloys containing the foregoing materials. The foregoing materials can be used singly or as a combination of two or more.

Among the above materials, ones that mainly contain Au, Ag, Cu, and Pt; or alloys containing the foregoing are preferable as the material configuring the source electrode 20a and the drain electrode 20b. Since such materials have a relatively large work function, the use of such materials in configuring the source electrode 20a, in the case where the organic semiconductor layer 30 is p-type, improves the injection efficiency of an electron hole (carrier) into the organic semiconductor layer 30.

In addition, the average thickness of the source electrode 20a and the drain electrode 20b is not limited to but preferred to be approximately 10 to 2000 nm or, more preferably, 50 to 1000 nm.

The interval between the source electrode 20a and the drain electrode 20b, or a channel length L shown in FIG. 2B, is preferred to be approximately 2 to 30 μm or, more preferably, 2 to 20 μm. By setting the channel length L within the foregoing range, the properties of the thin-film transistor 1 can be improved. Especially, the on-current can be increased.

Further, the width of the source electrode 20a and the drain electrode 20b, or a channel width W shown in FIG. 2B, is preferred to be approximately 0.1 to 5 mm or, more preferably, 0.3 to 3 mm. By setting the channel width W within the foregoing range, the parasitic capacitance can be reduced, which prevents the degradation in properties of the thin-film transistor 1. Furthermore, the larger sizing of the thin-film transistor 1 can also be prevented.

The organic semiconductor layer 30 is provided in contact with the source electrode 20a and the drain electrode 20b.

The organic semiconductor layer 30 contacts the buffer layer 60 by one part (the channel region). Due to the contact, the organic semiconductor layer 30 is oriented along the orientation of the buffer layer 60, or the channel length, which is the direction from either of the source electrode 20a or the drain electrode 20b to the other.

Examples of the material configuring the organic semiconductor layer 30 include: polymer organic semiconductor materials such as poly(3-alkylthiophene), poly(3-hexylthiophene) (P3HT), poly(3-octylthiophene), poly(2,5-thienylenevinylene) (PTV), poly(para-phenylenevinylene) (PPV), poly(9,9-dioctylfluorene) (PFO), poly(9,9-dioctylfluorene-cobis-N,N'-(4-methoxyphenyl) -bis-N,N'-phenyl-1,4-phenylenediamine) (PFMO), poly(9,9-dioctylfluorene-co-benzothiaziazole) (BT), fluorene-triarylamine copolymer, triarylamine series polymer, and fluorene-bithiophene copolymer (F8T2); as well as low-molecular organic semiconductor materials such as fullerene, metal phthalocyanine or the derivatives of the same, acene molecular materials such as anthracene, tetracene, pentacene, hexacene, etc., and α-oligothiophenes such as quaterthiophene (4T), sexithiophene (6T), octithiophene (8T), dihexylquaterthiophene (DH4T), dihexylsexithiophene (DH6T), etc. The above materials can be used singly or as a combination of two or more.

Among the above materials, ones that mainly contain a polymer organic semiconductor material are especially preferable. This is because polymer organic semiconductor materials are superior in carrier transportation and can be oriented relatively easily by a simple method.

Further, since the organic semiconductor layer 30 that is mainly configured of a polymer organic semiconductor material can be made thinner and lighter and is also superior in flexibility, it is suitable to be applied to the thin-film transistor 1 that is used as a switching element of a flexible display, etc.

Many of the organic polymer materials used for configuring the buffer layer 60 have an aryl group. Therefore, by configuring the organic semiconductor layer 30 using an organic semiconductor material having an aryl group, such as fluorene-triarylamine copolymers; triarylamine series polymers; and acene molecular materials, as a main material, high adhesiveness with the buffer layer 60 can be obtained.

The average thickness of the organic semiconductor layer 30 is not limited to but preferred to be approximately 0.1 to 1000 nm, more preferably, 1 to 500 nm or, much more preferably, 1 to 100 nm.

In addition, the organic semiconductor layer 30 can be a configuration that is selectively provided in the region (channel region) between the source electrode 20a and the drain electrode 20b or another configuration that is provided to cover almost all over the source electrode 20a and the drain electrode 20b.

The gate insulation layer 40 is provided so as to cover the organic semiconductor layer 30, the source electrode 20a, and the drain electrode 20b.

The gate insulation layer 40 insulates the gate electrode 50, which will be described later, from the source electrode 20a and the drain electrode 20b.

It is preferable that the gate insulation layer 40 is mainly configured of an organic material (organic polymer material, especially). The gate insulation layer 40 containing an organic polymer material as a main material is easy to be formed and, at the same time, can improve the adhesiveness with the organic semiconductor layer 30.

Examples of such an organic polymer material include: acrylic resins such as polystyrene, polyimide, polyamidimide, polyvinylphenylene, polycarbonate (PC), and polymethylmethacrylate (PMMA); fluoric resins such as polytetrafluoroethylene (PTFE); phenolic resins such as polyvinylphenol or novolac resin; olefinic resins such as polyethylene, polypropylene, polyisobutylene, polybutene; etc. The foregoing materials can be used singly or as a combination of two or more.

The average thickness of the gate insulation layer 40 is not limited to but preferred to be approximately 10 to 5000 nm or, more preferably, 100 to 2000 nm. By setting the thickness of the gate insulation layer 40 within the foregoing range, the operating voltage of the thin-film transistor 1 can be lowered while ensuring the insulation of the gate electrode 50 from the source electrode 20a and the drain electrode 20b.

In addition, as a material configuring the gate insulation layer 40, inorganic materials such as $SiO_2$ (silicon oxide), $Si_3N_4$ (silicon nitride), $Al_2O_3$, $Ta_2O_5$, BST, PZT, etc. can also be used.

Further, the gate insulation layer 40 is not limited to a single-layer configuration but can be a laminated configuration including a plurality of above-described organic or inorganic materials.

At a specific position on the gate insulation layer 40, that is, a position corresponding to the region between the source electrode 20a and the drain electrode 20b, the gate electrode 50 for applying an electric field to the organic semiconductor layer 30 is provided.

The material configuring the gate electrode 50 only needs to be, without limitation, a publicly known electrode material. Specifically, the following can be named: metal materials such as Pd, Pt, Au, W, Ta, Mo, Al, Cr, Ti, and Cu or alloys including the foregoing; carbon materials such as carbon black, carbon nanotube, fullerene, etc.; polythiophenes such as polyacethylene, polypyrrole, and poly-ethylenedioxythiophene (PEDOT); conductive polymer materials such as polyaniline, poly(p-phenylene), poly(p-phenylenevinylene), polyfluorene, polycarbazole, and polysilane or the derivatives of the foregoing; etc.

The average thickness of the gate electrode 50 is not limited to but preferred to be approximately 0.1 to 2000 nm or, more preferably, 1 to 1000 nm.

Further, the protective layer 70 is provided so as to cover the above-described layers.

The protective layer 70 has functions for preventing the infiltration of moisture into the organic semiconductor layer 30 and preventing the short circuit between adjoining thin-film transistors 1 that is caused at the contact of a foreign material to the gate electrode 50.

Examples of the material configuring the protective layer 70 are the same as those for the gate insulation layer 40.

The average thickness of the protective layer 70 is not limited to but preferred to be approximately 0.01 to 10 μm or, more preferably, 0.1 to 5 μm.

In addition, the protective layer 70 is provided according to need and can be omitted.

In the above thin-film transistor 1, when a gate voltage is applied to the gate electrode 50 with a voltage applied between the source electrode 20a and the drain electrode 20b, a channel is formed on the organic semiconductor layer 30, near the interface with the gate insulation layer 40. With the move of a carrier (electron hole) within the channel region, a current runs between the source electrode 20a and the drain electrode 20b.

That is, in the off-state where no voltage is applied to the gate electrode 50, even when a voltage is applied between the source electrode 20a and the drain electrode 20b, there runs only a slight current because there are almost no carriers in the organic semiconductor layer 30.

On the other hand, in the on-state where a voltage is applied to the gate electrode 50, a charge is induced in a region on the organic semiconductor layer 30 facing the gate insulation layer 40, and then a channel (carrier path) is formed. When a voltage is applied between the source electrode 20a and the drain electrode 20b under the above state, a current runs through the channel region.

The above active-matrix device 300 can be manufactured as follows.

A method for manufacturing the active-matrix device 300 (a method for manufacturing an organic semiconductor device according to the first embodiment of the invention) will be described below.

In addition, the following mainly describes a method for manufacturing the thin-film transistor 1.

A1: Pretreatment (Refer to FIG. 3A)

First, the substrate 500 is prepared and an orientation processing is performed on the top surface of the substrate 500.

With the above processing, the orientation of the buffer layer 60 is more ensured.

Examples of the orientation method include rubbing, laser processing, blast processing, etc. Among the foregoing, rubbing is especially preferable.

The rubbing in the above description is a processing method wherein the top surface of the substrate 500 is rubbed in a specific direction by pressing a roller 910, which is wrapped with a cloth 900 made of polyamide (nylon) for example, against the substrate 500 at a specific pressure. By such a rubbing method, the orientation processing of the substrate 500 can be performed relatively easily.

Conditions for performing the rubbing, which vary a little with materials of the substrate 500, etc., are not limited to but include the following, for example. The press depth is preferred to be approximately 0.01 to 1 mm or, more preferably, 0.1 to 0.5 mm. The rotational frequency is preferred to be approximately 10 to 5000 rpm or, more preferably, 100 to 1000 rpm. Further, the rolling rate is preferred to be approximately 0.01 to 50 m/min or, more preferably, 0.1 to 10 m/min.

A2: Forming a Buffer Layer (Refer to FIG. 3B)

Next, the buffer layer 60 is formed on the oriented surface of the substrate 500.

The buffer layer 60 can be formed by directly using the above-described organic polymer materials. However, it is preferable to form the buffer layer 60 by using the precursors of the organic polymer materials. By the latter method, the buffer layer 60 having a higher orientivity can be formed.

Specifically, the buffer layer 60 can be formed by: preparing a solution that is a compound including a single or two or more organic low-molecular materials having a polymeric group and a liquid crystal core; supplying the solution onto the substrate 500 to form a liquid film; removing the solvent (deliquoring) from the liquid film; and polymerizing the organic low molecules. Further, the buffer layer 60 can be a solution that is a compound including a single or two or more organic low-molecular materials having a polymeric group and a liquid crystal core and can be formed by supplying the solution onto the substrate 500 to form a liquid film and polymerizing the organic low molecules.

Examples of the polymeric group contained in the organic low molecules include: a (meta) acryl group, an epoxy group, a vinyl group, a styrene group, an oxetane group, etc.

As examples of such organic low-molecular materials, there are chemical compounds expressed in chemical formulas 1 to 19 below.

Chemical formula 1:

Chemical formula 2:

Chemical formula 3:

Chemical formula 4:

Chemical formula 5:

-continued

Chemical formula 6:

Chemical formula 7:

Chemical formula 8:

Chemical formula 9:

Chemical formula 10:

Chemical formula 11:

Chemical formula 12:

Chemical formula 13:

-continued

Chemical formula 14:

Chemical formula 15:

Chemical formula 16:

Chemical formula 17:

Chemical formula 18:

Chemical formula 19:

Further, examples of the method for supplying a solution onto the substrate 500 include: spin coating, casting, microgravure coating, gravure coating, bar coating, roll coating, wire-bar coating, dip coating, spray coating, screen printing, flexographic printing, offset printing, inkjetting, microcontact printing, etc. The foregoing methods can be employed singly or as a combination of two or more.

Furthermore, examples of the method for polymerizing an organic low-molecular material include photopolymerization reaction, thermal polymerization reaction, etc. In addition, the type of reaction can be set in accordance with: the type of organic low-molecular material, the type of polymerization initiator to be added in a solution, the type of polymerization promoter, etc.

A3: Forming a Source Electrode and a Drain Electrode (Refer to FIG. 3C)

Next, the source electrode 20a and the drain electrode 20b are formed on the buffer layer 60 along the orientation of the buffer layer 60 with a specific interval in between.

First, a metal film (metal layer) is formed on the buffer layer 60. The metal film can be formed by means of, for example: chemical vapor deposition (CVD) methods such as plasma CVD, thermal CVD, laser CVD, etc.; dry plating methods such as vacuum deposition, sputtering (low-temperature sputtering), ion plating, etc.; wet plating methods such as electrolytic plating, immersion plating, electroless plating, etc.; thermal spraying; sol-gel methods; MOD methods; metallic-foil bonding; etc.

After applying a photoresist material on the metal film and hardening the photoresist material, a photoresist layer that is shaped correspondingly to the source electrode 20a and the drain electrode 20b is formed. Using the photoresist layer as a mask, the unnecessary part of the metal film is removed. Examples of the method for removing the metal film include one of or a combination of two or more of the following: physical etching methods such as plasma etching, reactive ion etching, beam etching, light-assisted etching, etc.; and chemical etching methods such as wet etching, etc.

After that, by removing the photoresist layer, the source electrode 20a and the drain electrode 20b can be obtained.

Further, the source electrode 20a and the drain electrode 20b can also be formed by, for example: supplying a conductive material containing conductive particles onto the buffer layer 60 to form a liquid film; and performing a posttreatment (heating, infrared radiation, ultrasonication, etc. for example) to the liquid film according to need.

In addition, as the method for supplying a conductive material, the ones described in the above step A2 can be employed.

Further, in the step A3, the data lines 301 and the pixel electrodes 303 are also formed.

A4: Forming an Organic Semiconductor Layer (Refer to FIG. 3D)

Next, the organic semiconductor layer 30 is formed so that the organic semiconductor layer 30 contacts the source electrode 20a and the drain electrode 20b.

In the step A4, the organic semiconductor layer 30 is oriented along the orientation of the buffer layer 60, with part of the organic semiconductor layer 30 contacting part of the buffer layer 60 that is exposed in the region between the source electrode 20a and the drain electrode 20b.

Therefore, in the region (channel region) between the source electrode 20a and the drain electrode 20b, the organic semiconductor layer 30 is oriented along the channel-length direction.

The organic semiconductor layer 30 can also be formed by, for example: supplying a solution containing an organic semiconductor material or the precursor of an organic semiconductor material onto a specific region on the buffer layer 60, including the region between the source electrode 20a and the drain electrode 20b, to form a liquid film; and performing a posttreatment (heating, infrared radiation, ultrasonication, etc. for example) to the liquid film according to need.

In addition, as the method for supplying a solution, the ones described in the step A2 can be employed.

A5: Forming a Gate Insulation Layer (Refer to FIG. 3E)

Next, the gate insulation layer 40 is formed so as to cover the source electrode 20a, the drain electrode 20b, and the organic semiconductor layer 30.

The gate insulation layer 40 can be formed by the same method as for the organic semiconductor layer 30.

A6: Forming a Gate Electrode (Refer to FIG. 4F)

Next, the gate electrode 50 is formed on the gate insulation layer 40, at a position corresponding to the region between the source electrode 20a and the drain electrode 20b.

The gate electrode 50 can be formed by the same method as for the source electrode 20a and the drain electrode 20b.

Further, in the step A6, the scanning lines 302 are also formed.

In addition, in the first embodiment, the scanning lines 302, which are formed separately from the gate electrode 50, can also be formed by successively forming the gate electrodes 50 of adjoining thin-film transistors 1.

A7: Forming a Protective Layer (Refer to FIG. 4G)

Next, the protective layer 70 is formed on the gate insulation layer 40.

The protective layer 70 can be formed by the same method as for the organic semiconductor layer 30.

Second Embodiment

Next, a second embodiment of an active-matrix device will be described.

Figure 5:
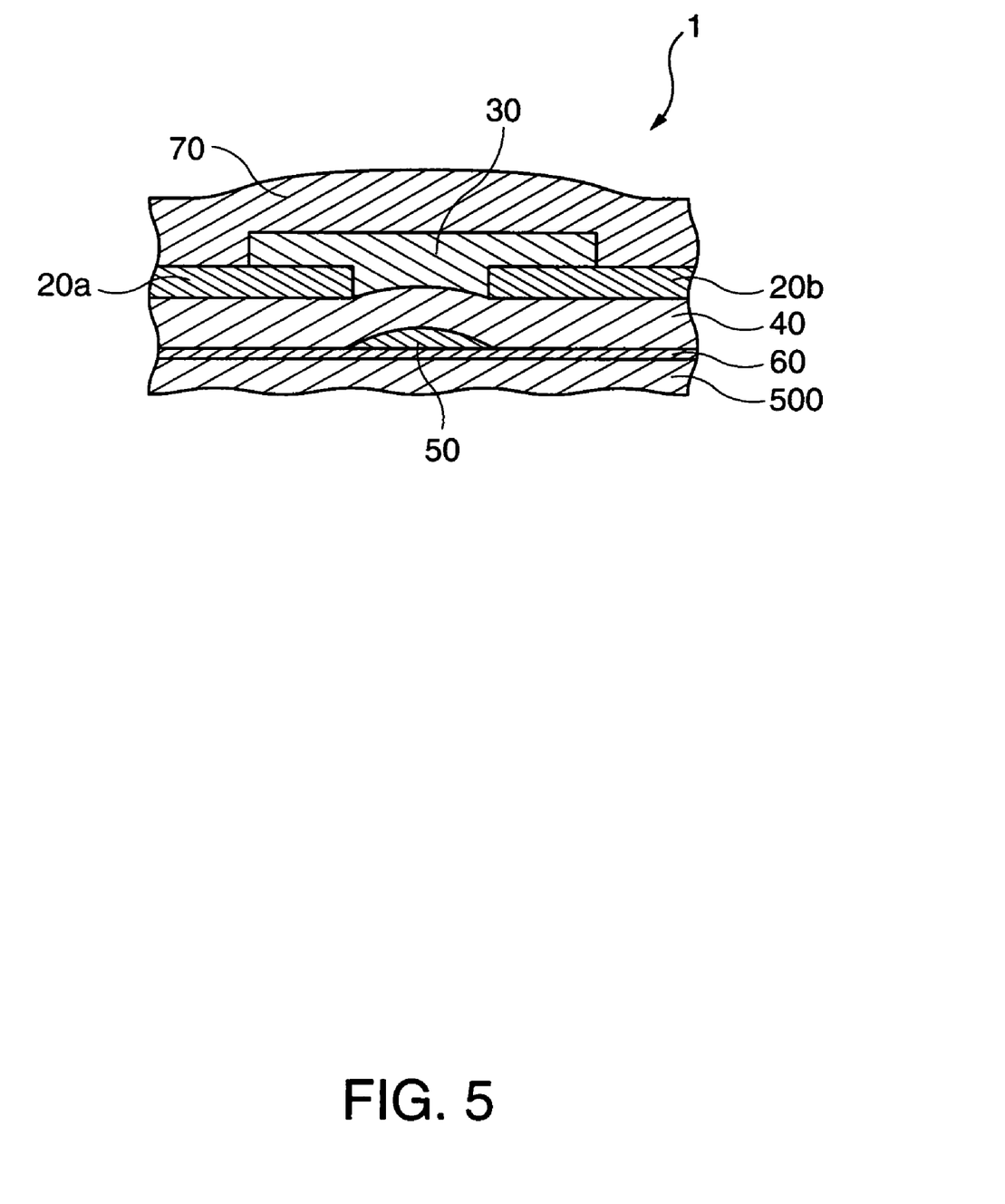
FIG. 5 is a diagram (vertical cross section) showing the configuration of an organic thin-film transistor included in an active-matrix device according to a second embodiment.

FIG. 5 is a diagram (vertical cross section) showing the configuration of an organic thin-film transistor included in an active-matrix device according to the second embodiment. In addition, in the following description, the upper side of FIG. 5 is expressed as "top" and the lower side is expressed as "bottom."

The following description for the second embodiment is mainly for the differences from the first embodiment and the descriptions of the same matters as for the first embodiment are omitted.

In the second embodiment, the thin-film transistor 1 has a bottom-gate configuration. The other matters are the same as in the first embodiment.

As shown in FIG. 5, the thin-film transistor 1 in the second embodiment has: the buffer layer (underlayer) 60 provided on the substrate 500; the gate electrode 50 provided on the buffer layer 60; the gate insulation layer 40 provided on the buffer layer 60 so as to cover the gate electrode 50; the source electrode 20a and the drain electrode 20b provided on the gate insulation layer 40 with an interval in between; the organic semiconductor layer 30 provided in contact with the source electrode 20a and the drain electrode 20b; and the protective layer 70 so as to cover the foregoing layers.

In the thin-film transistor 1, the gate insulation layer 40 is oriented along the orientation of the buffer layer 60, and the organic semiconductor layer 30 is oriented along the orientation of the gate insulation layer 40.

Under such circumstances, it is preferable that the material configuring the gate insulation layer 40 and the material configuring the buffer layer 60 are the same, although the case where the two materials are different is also allowable. By such a method, the orientation of the gate insulation layer along the orientation of the buffer layer 60 is more ensured. Therefore, even with a distance between the organic semiconductor layer 30 and the buffer layer 60, the organic semiconductor layer 30 can surely be oriented along the orientation of the buffer layer 60.

In addition, as described above, the organic polymer material used for the buffer layer 60, which is highly insulative, is also preferable as a material for configuring the gate insulation layer 40.

With the configuration according to the second embodiment, the same effect as in the first embodiment can be obtained.

The above thin-film transistor 1 can be manufactured as follows.

B1: Pretreatment

The same processing as in the step A1 is performed.

B2: Forming a Buffer Layer

The same processing as in the step A2 is performed.

B3: Forming a Gate Electrode

The same processing as in the step A6 is performed.

B4: Forming a Gate Insulation Layer

The same processing as in the step A5 is performed.

In the step B4, the gate insulation layer 40 is oriented along the orientation of the buffer layer 60, with part of the gate insulation layer 40 contacting the buffer layer 60 that is exposed from the gate electrode 50.

B5: Forming a Source Electrode and a Drain Electrode

The same processing as in the step A3 is performed.

B6: Forming an Organic Semiconductor Layer

The same processing as in the step A4 is performed.

In the step B6, the organic semiconductor layer 30 is oriented along the orientation of the gate insulation layer 40, with part of the organic semiconductor layer 30 contacting the gate insulation layer 40 that is exposed in the region between the source electrode 20a and the drain electrode 20b. That is, the organic semiconductor layer 30 is oriented along the orientation of the buffer layer 60.

B7: Forming a Protective Layer

The same processing as in the step A7 is performed.

Electronic Device

Next, as an example of an electronic device according to a third embodiment of the invention, an electrophoretic display device in which the above-described active-matrix device is provided will be described.

Figure 6:
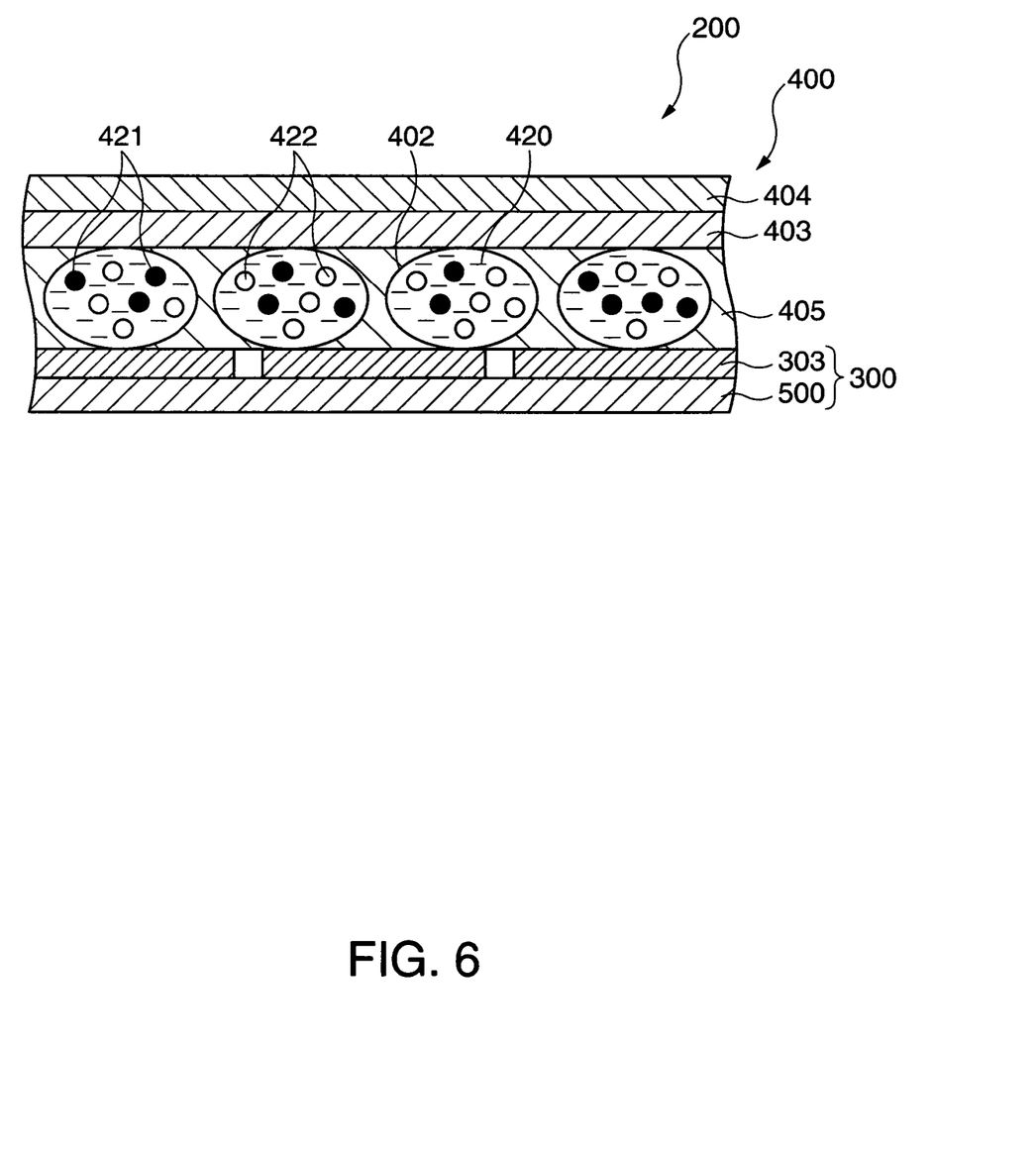
FIG. 6 is a vertical cross section showing a third embodiment wherein an electrophoretic display device is taken as an example.

FIG. 6 is a vertical cross section showing the third embodiment wherein an electrophoretic display device is taken as an example. In addition, in the following description, the upper side of FIG. 6 is expressed as "top" and the lower side is expressed as "bottom."

An electrophoretic display device 200 shown in FIG. 6 is configured of the above active-matrix device 300 and an electrophoretic display unit 400 provided on the active-matrix device 300.

The electrophoretic display unit 400 is configured of: a transparent substrate 404 having a transparent electrode (common electrode) 403; and microcapsules 402 fixed on the transparent electrode 403 with a binder 405.

Further, the active-matrix device 300 and the electrophoretic display unit 400 are bonded so that the microcapsules 402 contact the pixel electrodes 303.

In each of the microcapsules 402, an electrophoretic dispersion liquid 420 containing a plurality of different electrophoretic particles is encapsulated. In the third embodiment, the electrophoretic particles are two kinds of electrophoretic particles 421 and 422 having different charges and colors (hues).

In the above electrophoretic display device 200, when a selection signal (selection voltage) is supplied to a single or a plurality of the scanning lines 302, the thin-film transistors 1 coupled to the scanning lines to which the selection signal (selection voltage) is supplied are turned on.

By the above method, the data lines 301 and the pixel electrodes 303 that are coupled to the relevant thin-film transistors 1 become virtually conductive to each other. Under such circumstances, if a desired data (voltage) is supplied to the data lines 301, the data (voltage) is supplied to the pixel electrodes 303.

By the above method, an electric field is generated between each pixel electrode 303 and the transparent electrode 403, and the electrophoretic particles 421 and 422 electrophoretically migrate toward either of the electrodes in accordance with: the direction and strength of the electric field, the properties of the electrophoretic particles 421 and 422, etc.

On the other hand, when the supply of a selection signal (selection voltage) to the scanning lines 302 is stopped under the above state, the relevant thin-film transistors 1 are turned off and the data lines 301 and the pixel electrodes 303 coupled to the relevant thin-film transistors 1 become nonconductive to each other.

Therefore, with appropriate combinations of the supply and stop of a selection signal to the scanning lines 302 or the supply and stop of data to the data lines 301, desired images (information) can be displayed on the display surface (the side of the transparent substrate 404) of the electrophoretic display device 200.

Especially, in the electrophoretic display device 200 according to the third embodiment, by giving different colors to the electrophoretic particles 421 and 422, images of multiple tones can be displayed.

Further, the electrophoretic display device 200 according to the third embodiment, which has the active-matrix device 300, can selectively turn on/off the thin-film transistor 1 coupled to a specific scanning line 302. Therefore, crosstalk hardly occurs and, with the capability of faster circuit operation, high-quality images (information) can be obtained.

Furthermore, the electrophoretic display device 200 according to the third embodiment operates at a low drive voltage and therefore can achieve power saving.

In addition, the electrophoretic display device 200 according to the third embodiment, which is a so-called vertical-migration type using microcapsules, is not limited to the vertical-migration type but can be a so-called horizontal-migration type wherein pixel electrodes 303 and the common electrode 403 are provided laterally on the same substrate. Also, the electrophoretic display device 200 can be a device wherein electrophoretic particles drift within spaces, each of which are sectioned with walls that are formed on a substrate, without using microcapsules. Further, the application of a display device in which an active-matrix device having the above-described thin-film transistor 1 is not limited to the application to the above-described electrophoretic display device 200 but includes the application to, for example, organic EL devices, liquid crystal display devices, etc.

Electronic Apparatus

The above-described electrophoretic display device 200 can be provided in various electronic apparatuses. Electronic apparatuses having the electrophoretic display device 200 will be described below.

Electronic Paper

First, a fourth embodiment of the invention wherein the electronic apparatus according to the fourth aspect of the invention is applied to an electronic paper will be described.

Figure 7:
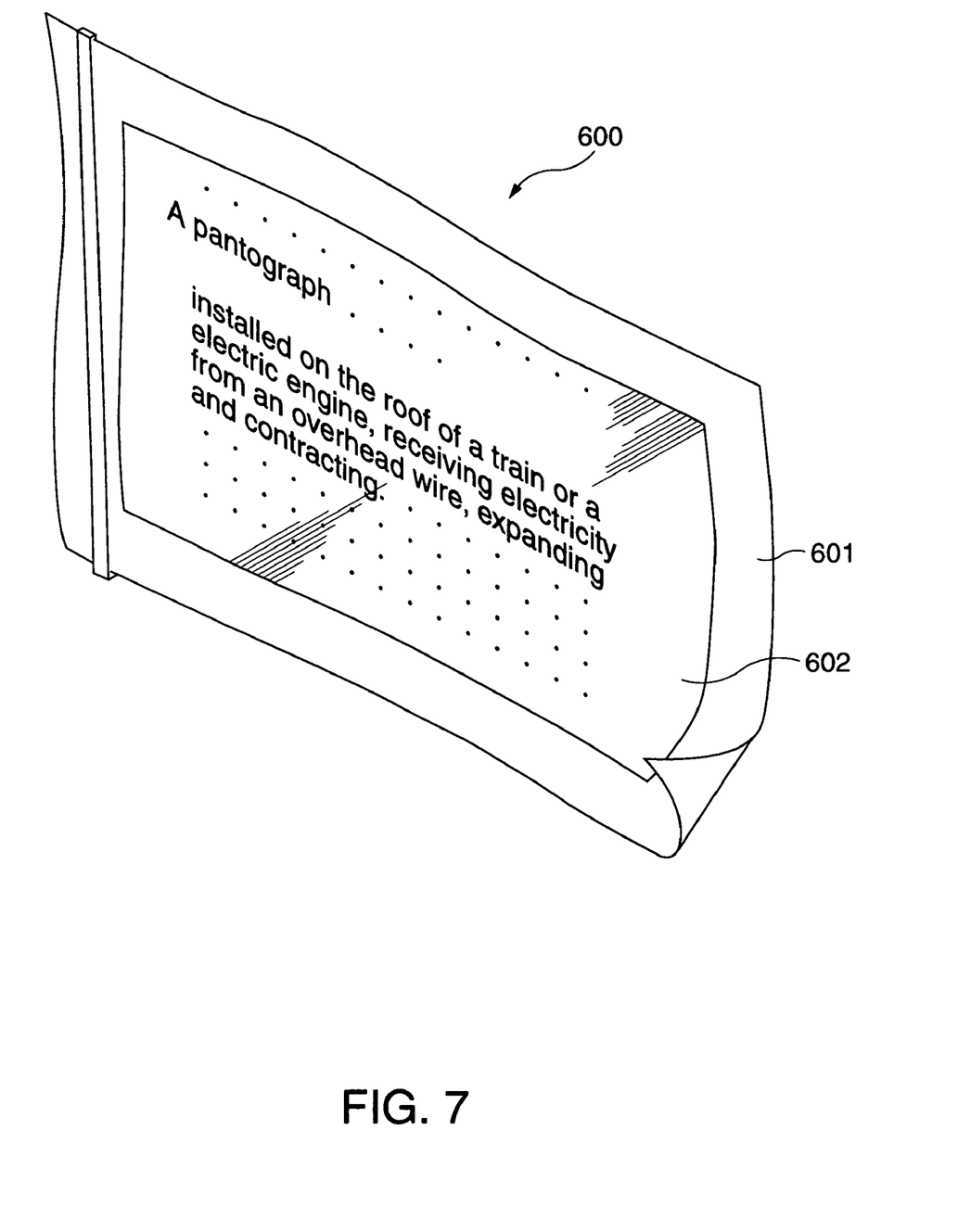
FIG. 7 is a perspective view showing a fourth embodiment wherein an electronic apparatus according to the fourth aspect of the invention is applied to an electronic paper.

FIG. 7 is a perspective view showing the fourth embodiment wherein the electronic apparatus according to the fourth aspect of the invention is applied to an electronic paper.

An electronic paper 600 shown in FIG. 7 has a main body 601 that is configured of a rewritable sheet having the same texture and flexibility as paper and a display unit 602.

In the electronic paper 600, the display unit 602 is configured of the above-described electrophoretic display device 200.

Display

Next, a fifth embodiment of the invention wherein the electronic apparatus according to the fourth aspect of the invention is applied to a display.

Figure 8A:
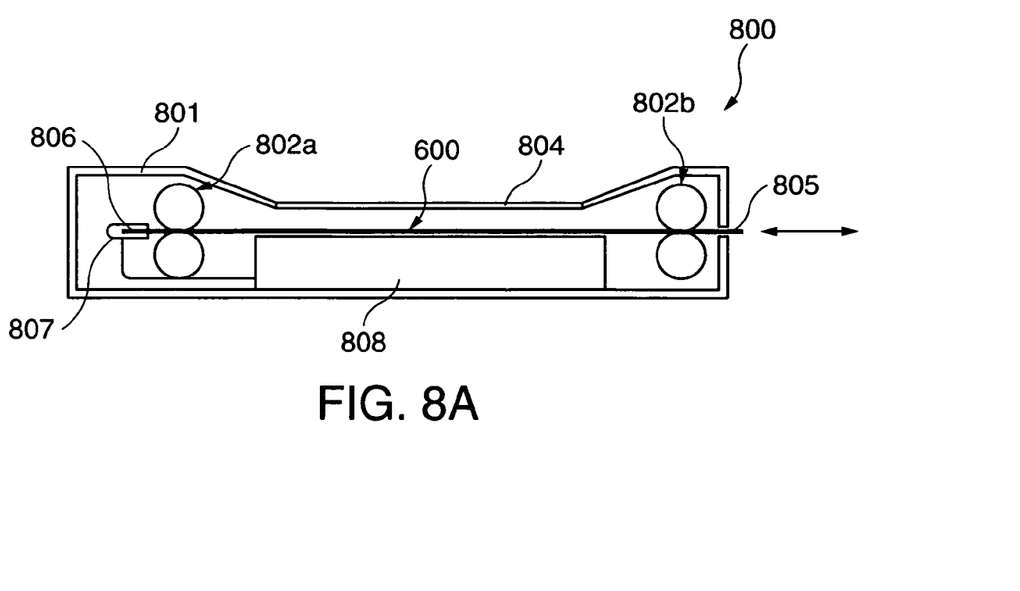
FIGS. 8A and 8B are diagrams showing a fifth embodiment wherein an electronic apparatus according to the fourth aspect of the invention is applied to a display.
Figure 8B:
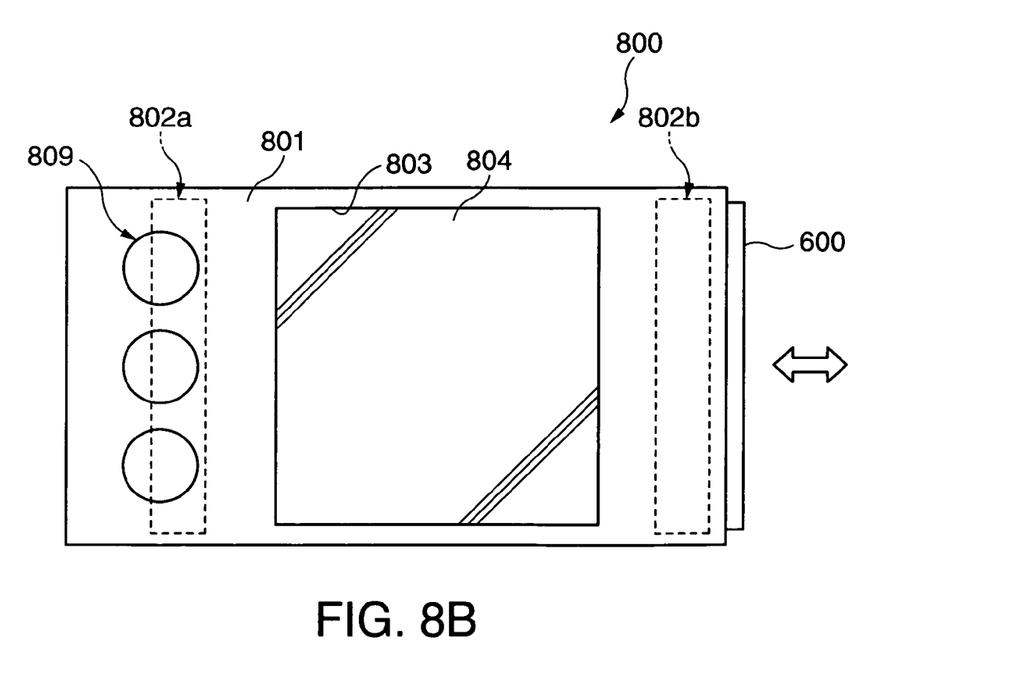

FIGS. 8A and 8B are diagrams showing a fifth embodiment wherein an electronic apparatus according to the fourth aspect of the invention is applied to a display. FIG. 8A is a cross section and FIG. 8B is a plan view.

A display 800 shown in FIGS. 8A and 8B has a main body 801 and an electronic paper 600 provided to be detachable from the main body 801. In addition, the electronic paper 600 has the above-described configuration, that is, the same configuration as shown in FIG. 7.

The main body 801 has an insertion slot 805 on the side (right side in FIG. 8A), from which the electronic paper 600 can be inserted, and two pairs of feeding rollers 802a and 802b inside. When the electronic paper 600 is inserted into the main body 801 through the insertion slot 805, the electronic paper 600 is set in the main body 801, sandwiched between each pair of feeding rollers 802a and 802b.

Further, on the display surface (the near side in FIG. 8B) of the main body 801, a rectangular opening 803 is formed, wherein a transparent glass plate 804 is mounted. With such a configuration, the electronic paper 600 set inside the main body 801 can be seen from outside. That is, the display surface of the display 800 is configured by showing the electronic paper 600 that is set inside the main body 801 through the transparent glass plate 804.

Further, on the edge on the insertion side (left side in FIG. 8A) of the electronic paper 600, a terminal 806 is provided. Inside the main body 801, a socket 807 to which the terminal 806 is coupled when the electronic paper 600 is set in the main body 801 is provided. To the socket 807, a controller 808 and an operation unit 809 are electrically coupled.

In the above display 800, the electronic paper 600 is provided to be detachable from the main body 801 and therefore can be used as a portable device when removed from the main body 801.

Further, in the above display 800, the electronic paper 600 is configured of the above-described electrophoretic display device 200.

In addition, the electronic apparatus according to the fifth embodiment of the invention is not limited to the above devices but includes: televisions, viewfinder or direct-view videotape recorders, car navigation devices, pagers, electronic organizers, calculators, electronic newspapers, word processors, personal computers, workstations, videophones, POS terminals, touch-panel apparatuses, etc. As the display unit of the foregoing electronic apparatuses, the electrophoretic display device 200 can be applied.

The method for manufacturing an organic semiconductor device, as well as the organic semiconductor device, the electronic device, and the electronic apparatus according to the embodiments of the invention, which have been described with reference to the drawings, are not limited to the above examples.

What is claimed is:

1. A method for manufacturing an organic semiconductor device having a gate electrode, a source electrode, a drain electrode, an organic semiconductor layer, a gate insulation layer, and a substrate, comprising:

forming, on the substrate, an underlayer that contains an organic polymer material having a liquid crystal core and is oriented in a specific direction, before forming the organic semiconductor layer; and forming the organic semiconductor layer so as to orient the organic semiconductor layer along the orientation of the underlayer, wherein: the gate insulation layer insulates the source electrode and the drain electrode from the gate electrode; and the substrate supports the gate electrode, the source electrode, the drain electrode, the organic semiconductor layer, and the gate insulation layer.

2. The method for manufacturing an organic semiconductor device according to claim 1, further comprising:

forming the source electrode and the drain electrode on the underlayer before forming the organic semiconductor layer; and forming the organic semiconductor layer with part of the organic semiconductor layer contacting the underlayer so as to orient the organic semiconductor layer along the orientation of the underlayer.

3. The method for manufacturing an organic semiconductor device according to claim 1, further comprising:

forming the gate electrode on the underlayer before forming the organic semiconductor layer;

forming the gate insulation layer with part of the gate insulation layer contacting the underlayer so as to orient the gate insulation layer along the orientation of the underlayer; and forming the organic semiconductor layer so as to orient the organic semiconductor layer along the orientation of the gate insulation layer.

4. The method for manufacturing an organic semiconductor device according to claim 3, further comprising:

forming the source electrode and the drain electrode on the gate insulation layer before forming the organic semiconductor layer; and forming the organic semiconductor layer with part of the organic semiconductor layer contacting the gate insulation layer so as to orient the organic semiconductor layer along the orientation of the gate insulation layer.

5. The method for manufacturing an organic semiconductor device according to claim 3, wherein a material configuring the underlayer and a material configuring the gate insulation layer are same.

6. The method for manufacturing an organic semiconductor device according to claim 1, wherein the source electrode and the drain electrode are formed along a specific direction with an interval in between.

7. The method for manufacturing an organic semiconductor device according to claim 1, wherein the underlayer is formed after performing an orientation processing of the substrate.

8. The method for manufacturing an organic semiconductor device according to claim 7, wherein the orientation processing is performed by means of rubbing.

9. The method for manufacturing an organic semiconductor device according to claim 1, wherein the underlayer is formed by polymerizing a compound containing at least a single or two or more organic low-molecular materials having a polymeric group and a liquid crystal core.

10. The method for manufacturing an organic semiconductor device according to claim 9, wherein the compound shows a liquid crystal phase under room temperature.

11. The method for manufacturing an organic semiconductor device according to claim 10, wherein the compound has a nematic phase.

12. The method for manufacturing an organic semiconductor device according to claim 10, wherein the compound has a smectic phase.

* * * * *